United States Patent [19]

Cowpland

[11] 4,000,379
[45] Dec. 28, 1976

[54] TONE GENERATOR

[75] Inventor: Michael C. J. Cowpland, Ottawa, Canada

[73] Assignee: Mitel Canada Limited, Canada

[22] Filed: Oct. 23, 1974

[21] Appl. No.: 517,376

[30] Foreign Application Priority Data
June 14, 1974 Canada .................. 202502

[52] U.S. Cl. .......................................... 179/84 VF
[51] Int. Cl.² ......................................... H04Q 9/12
[58] Field of Search ............... 179/84 VF, 90 K; 331/135, 136, 108 C, 108 D; 333/70 CR; 328/167; 330/107

[56] References Cited
UNITED STATES PATENTS

| | | | |
|---|---|---|---|
| 3,609,567 | 9/1971 | Kerwin et al. ................ | 333/70 CR |
| 3,611,194 | 10/1971 | Codd ............................ | 333/70 CR |
| 3,699,477 | 10/1972 | McKell ......................... | 333/70 CR |
| 3,720,887 | 3/1973 | Matthews ..................... | 333/70 CR |
| 3,805,178 | 4/1974 | Rollett ......................... | 328/167 |

Primary Examiner—Kathleen H. Claffy
Assistant Examiner—Joseph A. Popek
Attorney, Agent, or Firm—Craig & Antonelli

[57] ABSTRACT

A modified Sallen and key active filter useful for generating tones in a tone generator which can be connected to a telephone line. The modification allows a broad range of frequencies to be generated with a relatively constant output amplitude, the output signal of which can be usefully employed for D.T.M.F. or interoffice multifrequency signal generation.

16 Claims, 5 Drawing Figures

TONE GENERATOR

This invention relates to a structure for generating tone frequencies which may be applied to a telephone line.

Tone generators, which are useful for example for generating dialing tones from a push button telephone set, for signaling purposes on a telephone line, for transmitting data from a data set, etc., have normally taken two forms. One form, which is described in Canadian Patent No. 857,473 by M. C. J. Coupland issued Dec. 1, 1970, utilizes an amplifier and a twin T filter in feedback arrangement therewith. With total loop gain greater than 1, oscillation is effected where the twin T filter provides a 180° phase shift, and at an impedance null. Other types of filters can be used, principles of operation are still such that an amplifier with gain sufficient to overcome the loss in a feedback filter is required, and either inductances, or expensive and complex R-C filter arrangements are required. The trimming process for the filter, in order to provide very accurately defined frequencies, is normally complex and critical.

Another type of tone generator is as described in Canadian Patent No. 911,550 by M. C. J. Coupland issued Oct. 3, 1972. This uses a passive R-C type of filter, which has voltage gain greater than unity. In order to provide a feedback loop for oscillation, the filter feeds an amplifier, which has voltage gain of slightly less than unity, which still maintains a total loop voltage gain greater than unity. The amplifier used in this mode has certain great advantages: because its voltage gain need not be greater than unity, it can be very simple, such as an emitter follower amplifier. However the filter loading is extremely critical, and in order to obtain a flat frequency response from the total oscillator, the filter need be of the "all pass" type having a flat frequency response for the frequency band to be generated. Oscillation occurs where phase shift passes through 180°. Yet the number of components in this circuit is high, and the trimming requirements are critical.

It is obvious, therefore, that for the production of large quantities of tone generators, it is desirable to have a minimum number of components, a relatively flat output frequency response within the frequency band to be generated, and minimal distortion. It therefore is highly desirable to utilize an amplifier which has the least possible gain for the achievement of these requirements. In order to achieve these results, the design of the filter is highly critical.

The prior art tone generators noted above have been able to generate tone frequencies with approximately uniform output levels and low distortion for the tuning range required for the standard D.T.M.F. (push button "touch tone" type dialing) signaling systems. The signaling frequencies have been standardized at a low group of frequencies of 697, 770, 852 and 941 hertz group, and at a high group of frequencies of 1209, 1336, 1477 and 1633 hertz.

One oscillator is required to generate one frequency of the low group and an additional oscillator is required to simultaneously generate one frequency of the high group. The tuning range of each oscillator is usually not much broader than 1.35:1, as required to cover the aforenoted frequency groups.

One of the embodiments of this invention will provide a much broader tuning range than those of the aforenoted prior art, and can therefore be advantageously used, in addition to D.T.M.F. dialing, for interoffice multifrequency signaling, which requires a tuning range of 2.4:1. The frequencies for interoffice multifrequency signaling have been standardized in North America 700, 900, 1100, 1300, 1500 and 1700 hertz, although it is clear that this invention is not limited thereto.

I have invented a tone generator which utilizes a smaller number of components than in the aforenoted designs, making it highly desirable for mass production. The amplifier voltage gain is low, preferably between 1 and 1.5, and is typically 1.35. In order to provide a tone generator with low distortion and relatively constant output for all the required generated frequencies, I have introduced modifications to a Sallen and Key active filter, which modifications obtain uniform resonant frequency loss through the filter for the aforenoted frequencies.

I have provided a frequency determining active filter for use in a tone generator comprising: a linear amplifier; a first capacitor and a first resistor connected in serial relationship between the output and the input in the amplifier, the first resistor being connected to said input; a second capacitor connected between said input and ground; a frequency determining resistor having one terminal connected to the junction of the first capacitor and the first resistor, its other terminal being adapted to be connected to alternating current ground; characterized by, the frequency determining resistor being made up of a series of resistance means; and a capacitance means connected between the junction of a pair of said resistance means and alternating current ground.

A better understanding of the invention will be obtained by reference to the description below, and the following FIGURES, in which.

Figure 1:
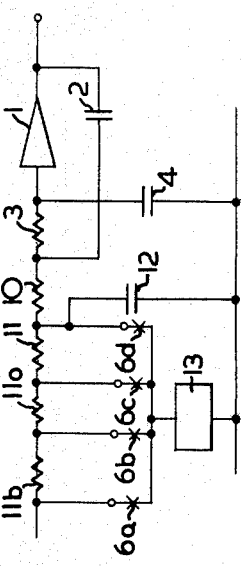
FIG. 1 is a basic schematic of a prior art Sallen and Key low pass filter.

Turning now to FIG. 1, which shows in basic schematic a Sallen and Key active filter according to the prior art, to a linear amplifier 1 is connected a first capacitor 2 and a first resistor 3 in series between the output of amplifier and its input. A second capacitor 4 is connected between the amplifier input and ground. A frequency determining resistor 5, which, with the other components determine the oscillation frequency, is connected between the first resistor 3 and alternating current ground, shown here as the same ground to which capacitor 4 is connected. The frequency determining resistor 5 may be connected to alternating current (AC) ground by means of a switch 6, and upon closure of the switch, filtering or oscillation at a frequency partly determined by the resistance of resistor 5 is caused.

Figure 4:
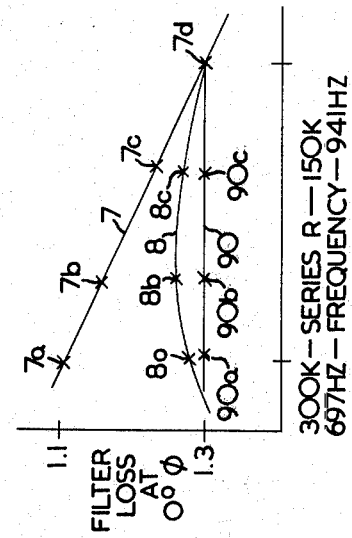
FIG. 4 is a graph depicting the filter loss at various frequencies (shown as impedances) according to the prior art, and according to the present invention.

Turning for a moment to FIG. 4, a relationship 7 between the filter loss at zero phase shift, where oscillation occurs, and the value of series resistance of resistor 5 is shown. As an example, consider various resistors 5 which are switched at points 7a, 7b, 7c, and 7d. Since the circuit will oscillate at the zero phase shift point, it will be seen that the switching of various valued resistors 5 will cause oscillation at different frequencies, the lower the resistance of the resistor 5, the higher frequency generated. As an example, a 300K ohm resistor could cause generation of a 697 hertz signal while a 150K ohm resistor could generate a 941 hertz signal.

However, it will be noted that the filter loss decreases substantially, the higher the value of resistor 5. Accordingly, the output signal generated by the oscillator will not be constant in amplitude across the frequency band of interest, and indeed will cause the distortion to increase at lower frequencies or cause the amplifier not to oscillate at all due to the high filter loss at higher frequencies.

It is obvious that the Sallen and Key filter circuit has not been useful for the generation of critical tone frequencies according to the requirements noted earlier, due to the just described deficiencies. Yet the number of components used in such a circuit is lower than that of the prior art.

Nevertheless, I have discovered a way of using a circuit similar to the Sallen and Key active filter circuit in a tone generator, keeping the filter loss at the oscillation frequency roughly constant: constant enough for use as a tone generator according to the aforenoted requirements. The constancy of the filter loss allows design of the remainder of the circuit to cause minimal distortion, to use a low gain amplifier, and to have a relatively constant output signal at all the frequencies required. The reduced number of components considerably reduces the cost of the tone generator.

Indeed, the use of my invention provides a relationship of filter loss with frequency (or with value of frequency determining resistor) shown as curve 8 in FIG. 4. The drastic filter loss change with resonant frequency according to the Sallen and Key prior art circuit is substantially eliminated.

Figure 2:
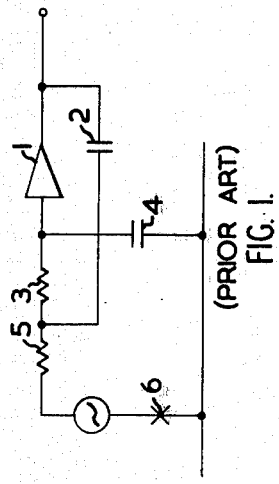
FIG. 2 is a basic schematic of the filter circuit in one embodiment of the invention.

Turning now to FIG. 2, it may be seen that a linear amplifier 1 is provided, to which first capacitor 2 and first resistor 3 are connected in series relationship between the output of the linear amplifier 1 and the input thereof, as in the Sallen and Key circuit. The resistor 3, of course, is connected to the input of the amplifier. A second capacitor 4 is connected between the amplifier input and ground, also as in the Sallen and Key circuit. I now provide a frequency determining resistor 10, which has one terminal connected to the junction the first capacitor 2 and the first resistor 3. The other terminal of resistor 10 is adapted to be connected to alternating current ground.

The frequency determining resistor is made up of a series of resistance means, which can be, for instance, a pair of resistors 10 and 11. However in any invention a capacitance means 12 is connected between the junction of resistors 10 and 11, and alternating current ground.

I have found that with the presence of the frequency determining resistor 10, the connection of the second resistor 11 to alternating current ground in order to cause generation of an oscillation signal will allow the filter loss at the frequency of oscillation to remain roughly constant, provided capacitance means 12 is also connected to ground from the junction between resistors 10 and 11.

It is clear that resistor 11 can be comprised of further segments, such as shown at 11a and 11b. Any terminal of resistor 11 can be connected to alternating current ground, the total value of resistors 10, 11, 11a, 11b, etc. determining the frequency to be generated. Yet the presence of capacitor 12 will keep the output frequency amplitude, i.e. the effective filter loss, to be roughly constant over the frequency band of interest.

In completion of the description, in FIG. 2 switches 6a, 6b, 6c, and 6d are shown which connect any terminal of resistances 11, 11a, and 11b to alternating current ground. These switches may usefully be embodied in the switching matrix of a telephone push button pad, in a data terminal push button pad, or may be electronically actuated in a semiconductor switch, for example, where external signals are to be used to switch the tone generator.

A voltage reference 13 may be included between ground and the common of switches 6a, 6b, 6c, and 6d.

It may be seen that closing any of these switches will cause a signal to be generated at a particular frequency on curve of FIG. 4, for instance at point 8a, 8b, 8c, or 7d. Since switch 6d, in FIG. 2, short circuits capacitor 12 to ground, the frequency determining resistor 10 will be the only one in the circuit, and will cause oscillation to occur at the same point as in the prior art circuits, point 7d.

Of course, it should be noted that capacitor 12 could alternatively have been connected to the junction between resistors 11 and 11a, whereupon the curve 8 in FIG. 4 would follow curve 7 from point 7d to point 7c, but depart to a flatter characteristic between points 7c and 7a.

It should also be noted that while in FIG. 2 resistors 11, 11a, and 11b have been shown in series, this structure is described as one embodiment. Since the resistor values will be additive as a switch connected further from switch 6d is closed, the non-trimmed tolerances in the resistors will tend to cancel out. However, resistors 11, 11a, and 11b could just as easily have been placed in parallel, each of which being individually switched, whereupon each resistor by itself would carry the full frequency determining value in series combination with resistor 10.

Figure 3:
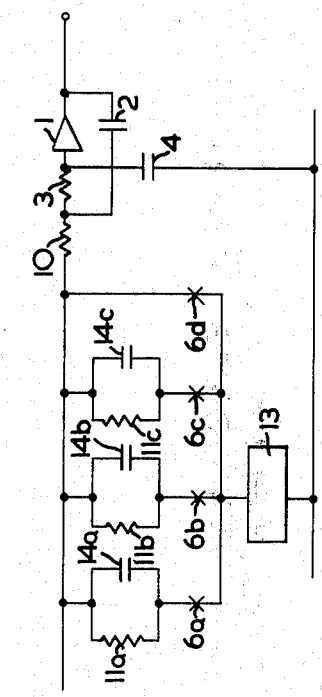
FIG. 3 is a basic schematic of the filter circuit in another embodiment of the filter of this invention.

Shown in FIG. 3 is a second embodiment, for providing an even flatter filter loss, i.e. frequency response, with frequency. In this case, resistors 11a, 11b, and 11c are each connected to frequency determining resistor 10. However, in parallel with each of resistors 11a, 11b, and 11c are capacitors 14a, 14b and 14c, each of which corresponds to capacitor 12 of FIG. 2. The resistor and capacitor parallel circuits are switched as described earlier, through switches 6a, 6b, and 6c, to alternating current ground, in order to select a particular frequency of oscillation, as in their junction to resistor 10 through switch 6d. However, in this case each of the resistors 11a, 11b, and 11c are selected in combination with resistor 10 to cause oscillation at the particular frequency, and are not additive with each other. Capacitors 14a, 14b, and 14c however, can be specifically selected in order to obtain the most optimum filter loss at the generated frequency, and an unexpectedly flat signal output signal at a broad range of frequencies.

It may be seen in FIG. 4 that curve 8 is not exactly flat, and rolls off at lower and higher frequencies. The circuit of FIG. 3 can cause the filter loss to be much flater than that shown in curve 8, for instance to follow the curve 90. This embodiment is particularly useful for the provision of interoffice multifrequency signals, with its much larger frequency range. Corresponding switch frequencies are as shown at points 90a, 90b, 90c and 7d.

Turning back to FIG. 2 for a moment, it has been found that for voice frequencies over a telephone line, a highly desirable relationship of the values of the capacitors are that first capacitor 2 should have roughly six times the capacitance of second capacitor 4, and capacitor 12 should have roughly two times the capacitance of capacitor 4. A typical value for capacitor 4 is roughly 500 picofarads for the aforenoted low group of frequencies, and roughly 330 picofarads for the high group of frequencies.

The amplifier should have a voltage gain above 1, to about 3. A preferred range of gain is between 1.2 and 1.5, with a typical value of about 1.35.

Figure 5:
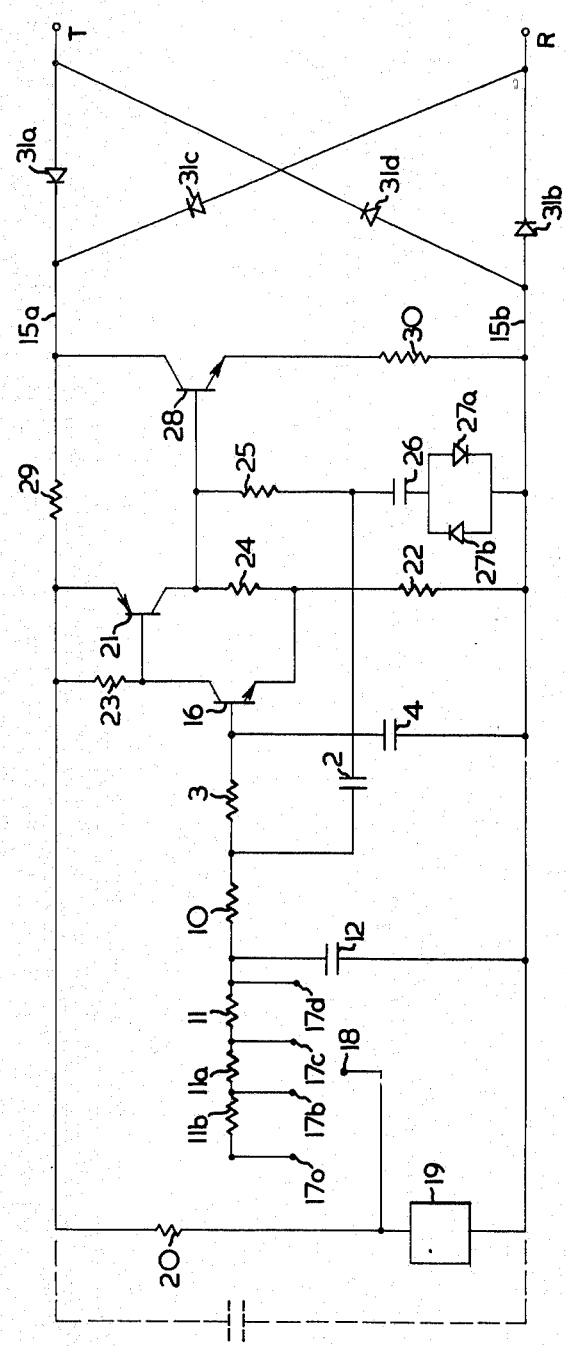
FIG. 5 is a detailed schematic of one embodiment of this invention.

FIG. 5 shows a schematic diagram of one embodiment of the invention in detail. The tone generator is adapted to be connected between a pair of leads 15a and 15b of a telephone line, which may be the tip and ring leads respectively. A first resistor 3 is connected to the input of the amplifier, at the base of a first transistor 16. The other terminal of the first resistor 3 is connected to first capacitor 2, which is also connected to the output of the amplifier. Also connected to the base of transistor 16 is second capacitor 4, which is also connected to lead 15b, considered here as ground. A frequency determining resistor 10 is connected to the first resistor 3, the other terminal of which is connected through capacitance means 12 to lead 15b. Resistors 11, 11a, and 11b are connected in series with resistor 10, their junction points and external terminals being brought out to switch points 17a, 17b, 17c, and 17d, which are adapted to be connected to alternating current ground in order to cause the circuit to oscillate and generate a tone. Switch point 18 will therefore be connected by an external switching matrix to one of points 17a-17d, in order to effect one of the frequencies.

Of course, resistors 10, 11, and capacitor 12 can be connected as in any of the described embodiments noted earlier, in order to obtain the desired switching frequencies and filter losses, and additional capacitors such as 14, 14a, 14b, and 14c of FIG. 3 can be used as described with reference thereto. Of course, other arrangements may also become clear to someone skilled in the art understanding this invention within the ambit of this invention, such as the frequency determining components forming parts of other apparatus, or appearing in other forms, but exhibiting the required electrical characteristics.

In order to bias the amplifier on at a particular voltage level, voltage reference 19 can be connected in series with a current limiting resistor 20 to lead 15a, whereby a constant voltage is obtained at switch point 18 which is connected to their junction. Voltage reference 19 can be a zenor diode, or a circuit designed to effect a similar function.

Turning to the amplifier, the collector of the first transistor 16 is connected to the base of second transistor 21, which is of opposite polarity type to transistor 16. The emitter of transistor 21 is connected to lead 15a. A third resistor 22 connects the emitter of transistor 16 to lead 15b. A fourth resistor 23 connects the base of transistor 21 to its emitter. A fifth resistor 24 connects the collector of the second transistor to the emitter of the first transistor.

It is preferred that the output signal of the amplifier be controlled to a predetermined level, and therefore a clipping circuit is connected in shunt therewith. A sixth resistor interconnects the collector of second transistor 21 through a circuit comprising capacitor 26 in series with a pair of oppositely poled parallel connected clipping diodes 27a and 27b, the other terminal of the circuit being connected to 15b, ground. Capacitor 2 is connected to the junction of resistor 25 and the circuit, as at capacitor 26.

Accordingly, we have modified a Sallen and Key filter, to include the amplifier which comprises transistors 16 and 21 in a feedback loop, which amplifier has gain preferably of approximately 1.35. With the capacitance values previously noted, the filter loss at the frequency of oscillation will be designed to be in the range of 1.3, resulting in an overall loop gain. In order to keep the circuit from saturating, the clipping circuit, which includes clipping diodes 27a and 27b, soft limits with capacitor 26 the output signal. The signal is thus kept within the linear range of the amplifier, and thus from being highly distorted due to the amplifier saturating or cutting off.

In order to properly couple the generated signal to a telephone line or the like, a stage of current amplification is provided.

The collector of transistor 21 is connected to the base of a third transistor 28, which is of the same polarity type as the first transistor 16. It is preferable to decouple the transistor circuit which includes transistors 16 and 21 from the telephone line, through seventh resistor 29, which is in series with lead 15a connected to the telephone line. Accordingly, the collector of third transistor 28 will be connected to wire 15a, while the emitter of transistor 21 and resistor 23 will be connected to the other terminal of resistor 29. An eighth resistor 30 connects the emitter of transistor 28 to lead 15b.

In the present embodiment, transistors 16 and 28 are of NPN type, while transistor 21 is of PNP type, due to the requirement for single polarity power, which power is obtained from the telephone line to which the tone generator is connected, a well known diode bridge circuit comprising diodes 31a, 31b, 31c, and 31d is connected in series with the line to the tip and ring leads T and R of the telephone line. With the diode bridge connected in opposite polarity, opposite polarity type transistors can be used.

Accordingly, I have described above a tone generator, and particularly a novel form of a frequency determining filter used therewith which can be fabricated at generally less cost than other signal generators, and which is capable of providing a relatively constant output amplitude with frequency change, within the normal audio telephone line band width, with relatively low distortion.

I claim:
1. A tone generator comprising:
  a. a linear amplifier,
  b. a first capacitor and a first resistor connected in serial relationship between the output and the input of the amplifier, the first resistor being connected to said input,
  c. a second capacitor connected between said input and alternating current ground,
  d. a frequency determining resistor having one terminal connected to the junction of the first capacitor and the first resistor, its other terminal being adapted to be connected to alternating current ground, characterized by e. the frequency determining resistor being made up of a series of resistance means, f. a capacitance means connected between the junction of a pair of said resistance means and alternating current ground.

2. A tone generator as defined in claim 1, in which each junction of each pair of resistance means is adapted to be individually connected to alternating current ground for initiating and generating a particular frequency signal.

3. A tone generator as defined in claim 2, in which the capacitance means is connected between the junction of the first pair of resistance means which has one terminal connected to the first resistor.

4. A tone generator as defined in claim 3, in which the first capacitor has approximately six times the capacitance of the second capacitor, and the capacitance means is comprised of a capacitor having approximately two times the capacitance as the second capacitor.

5. A tone generator comprising:

a. a linear, zero phase shift amplifier, b. a first capacitor and a first resistor connected in serial relationship between the output and the input of the amplifier, the first resistor being connected to said input, c. a second capacitor connected between said input and alternating current ground, d. a frist frequency determining resistor having one terminal connected to the junction of the first capacitor and the first resistor, its other terminal being adapted for connection to alternating current ground, to cause oscillation at a first particular frequency, e. a second frequency determining resistor connected in parallel with a third capacitor to said other terminal of the first frequency determining resistor, the other terminal of the second frequency determining resistor being adapted for connection to alternating current ground, to cause oscillation at a second particular frequency.

6. A tone generator as defined in claim 5, further including a plurality of frequency determining resistors, each connected in parallel with a capacitor, having one terminal connected to said other terminal of the first frequency determining resistor, and their other respective other terminals adapted for being individually connected to ground, to cause oscillation at a plurality of signal frequencies.

7. A tone generator as defined in claim 6, in which the voltage gain of the amplifier is between 1 and substantially 1.5.

8. A tone generator comprising:

a. a linear zero phase shift amplifier having greater than unity gain, b. a first capacitor connected to the output of the amplifier, and a first resistor connected between the other terminal of the capacitor and the input of the amplifier, c. a second capacitor connected between the input of the amplifier and ground, d. a first frequency determining resistor connected to the junction of the first capacitor and first resistor, e. a second frequency determining resistor and a third capacitor having one terminal of each connected to the other terminal of the first frequency determining resistor, f. means for connecting the other terminal of the third capacitor and the other terminal of the second frequency determining resistor to alternating current ground.

9. A tone generator as defined in claim 8, in which said other terminal of the third capacitor is connected to ground, further including potential reference means connected to alternating current ground, and terminal means for connection of the other terminal of the second frequency determining resistor to the potential reference means for initiation of said signal.

10. A tone generator as defined in claim 8, in which said other terminal of the third capacitor is connected to ground, further including a plurality of frequency determining resistors connected in series with the second frequency determining resistor, and means for selectively connecting any of the terminals of any of the frequency determining resistors, with the exception of the junction of the first frequency determining resistor and said first resistor, to alternating current ground.

11. A tone generator as defined in claim 10, including clipping means connected to the output of said amplifier, adapted to limit the amplitude of the signal entering said first capacitor.

12. A tone generator as defined in claim 11, including a current amplifier connected to the output of the zero phase shift amplifier, and means for applying an output signal of the current amplifier to a telephone type line.

13. A tone generator as defined in claim 12, in which said alternating current ground comprises a potential means for providing a fixed voltage reference above ground.

14. A tone generator as defined in claim 10, in which said amplifier is adapted to be connected between a pair of leads of a telephone type line, said amplifier being comprised of a first transitor having its base connected to said first resistor and second capacitor, its emitter connected to one of said leads through a third resistor, its collector connected to the other of said wires through a fourth resistor; a second transistor of opposite polarity type from the first transistor, its base connected to the collector of the first transistor, its emitter connected to said other of said leads, and its collector connected to the emitter of the first transistor through a fifth resistor, said first capacitor being connected to the collector of the second transistor through a sixth resistor, and also to a series circuit comprised of a capacitor, and a pair of oppositely poled parallel clipping diodes, which circuit is also connected to ground.

15. A tone generator as defined in claim 14, further including a seventh resistor isolating the junction of the emitter of the second transistor from said one lead; and a third transistor of the same polarity as the first transistor, having its collector connected to one lead, its base connected to the collector of the second transistor, and its emitter connected to said other lead through an eighth resistor.

16. A tone generator as defined in claim 14 further including a ninth resistor connected in series with a constant voltage means between said pair of wires.

* * * * *